United States Patent
Shiode (10) Patent No.: US 10,828,808 B2
(45) Date of Patent: Nov. 10, 2020

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Yoshihiro Shiode, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 695 days.

(21) Appl. No.: 15/492,314

(22) Filed: Apr. 20, 2017

(65) Prior Publication Data

US 2017/0305043 A1 Oct. 26, 2017

(30) Foreign Application Priority Data

Apr. 25, 2016 (JP) .................................. 2016-087383

(51) Int. Cl.
*B29C 43/02* (2006.01)
*B29C 43/58* (2006.01)
(Continued)

(52) U.S. Cl.
CPC ............ *B29C 43/021* (2013.01); *B29C 43/58* (2013.01); *G03F 7/0002* (2013.01);
(Continued)

(58) Field of Classification Search
CPC .............................. B29C 43/021; B29C 43/58
See application file for complete search history.

(56) References Cited

U.S. PATENT DOCUMENTS 8,556,616 B2 10/2013 Resnick et al.
9,280,047 B2 3/2016 Tanaka
(Continued)

FOREIGN PATENT DOCUMENTS

CN          1876395 A    12/2006
CN       101009218 A     8/2007
(Continued)

OTHER PUBLICATIONS

Office Action issued in Korean Appln. No. 10-2017-0051374 dated Oct. 7, 2019.
(Continued)

*Primary Examiner* — Jacob T Minskey
*Assistant Examiner* — Melody Tsui
(74) *Attorney, Agent, or Firm* — Rossi, Kimms & McDowell LLP (57) ABSTRACT

The present invention provides an imprint apparatus which forms a pattern of an imprint material on a substrate by using a mold, the apparatus comprising a control unit configured to control a process of deforming the mold into a convex shape and bringing the mold and the imprint material into contact with each other, wherein the control unit determines, based on information indicating a relationship between a relative tilt between the mold and the substrate, and a moment which fluctuates the relative tilt at a time of contact between the mold and the imprint material, a target relative tilt such that a moment generated at the time of contact between the mold and the imprint material falls within an allowable range, and starts contact between the mold and the imprint material after setting the relative tilt to the target relative tilt.

15 Claims, 7 Drawing Sheets

(51) Int. Cl.
   *G03F 7/00*    (2006.01)
   *H01L 21/67*   (2006.01)
   *H01L 23/544*  (2006.01)

(52) U.S. Cl.
   CPC ...... *H01L 21/67092* (2013.01); *H01L 23/544* (2013.01); *B29C 2043/585* (2013.01); *B29C 2043/5808* (2013.01); *B29C 2043/5833* (2013.01); *B29C 2043/5858* (2013.01)

(56) References Cited

U.S. PATENT DOCUMENTS

| | | |
|---|---|---|
| 9,285,675 B2 | 3/2016 | Hamaya |
| 10,073,339 B2 | 9/2018 | Nakagawa |
| 2016/0297136 A1 | 10/2016 | Wakabayashi |
| 2017/0274418 A1 | 9/2017 | Shiode |

FOREIGN PATENT DOCUMENTS

| | | | |
|---|---|---|---|
| JP | 2009536591 A | | 10/2009 |
| JP | 2011000885 A | | 1/2011 |
| JP | 2012094818 A | | 5/2012 |
| JP | 2013055327 A | | 3/2013 |
| JP | 2013058517 A | | 3/2013 |
| JP | 2014022527 A | | 2/2014 |
| JP | 2015050437 A | * | 3/2015 |
| JP | 2015050437 A | | 3/2015 |
| JP | 2015130448 A | | 7/2015 |
| JP | 2016021440 A | | 2/2016 |
| JP | 2016201455 A | | 12/2016 |
| JP | 2017174904 A | | 9/2017 |
| KR | 1020130018173 A | | 2/2013 |
| WO | 2007132320 A2 | | 11/2007 |

OTHER PUBLICATIONS

Office Action issued in Chinese Application No. 201710265042.1 dated Jun. 4, 2020. English translation provided.

* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint apparatus which transfers a concave-convex pattern to an imprint material on a substrate by using a mold including a pattern region, where the pattern has been formed, has received attention as one kind of lithography apparatus for mass-producing semiconductor devices and the like. The imprint apparatus can form the pattern in the imprint material on the substrate by performing an imprint process of curing the imprint material on the substrate in a state in which the mold and the imprint material are in contact with each other. In such an imprint apparatus, if bubbles remain in the pattern of the mold when bringing the mold and the imprint material into contact with each other, a defect may occur in the pattern formed in the imprint material. Japanese Patent Laid-Open No. 2009-536591 has proposed a method of reducing bubbles remaining in a pattern of a mold by deforming a pattern region of the mold into a convex shape protruding toward a substrate to bring the mold and an imprint material into contact with each other.

In general, when the mold and the imprint material on the substrate are brought into contact with each other, servo control of the relative tilt between the mold and the substrate can be performed. However, if the mold and the imprint material on the substrate are brought into contact with each other in the state in which the pattern region is deformed into the convex shape, a moment which fluctuates the relative tilt between the mold and the substrate may occur at the time of contact between the mold and the imprint material. If such a moment occurs, the mold and the substrate may relatively swing, causing a malfunction such as insufficient filling of the concave-convex pattern (concave portion) of the mold with the imprint material or the extension of filling time with the imprint material.

SUMMARY OF THE INVENTION

The present invention provides, for example, a technique advantageous in reducing a moment generated at the time of contact between a mold and an imprint material on a substrate.

According to one aspect of the present invention, there is provided an imprint apparatus which forms a pattern of an imprint material on a substrate by using a mold, the apparatus comprising: a deformation unit configured to deform the mold into a convex shape protruding toward the substrate; and a control unit configured to control a process of deforming the mold by the deformation unit and bringing the mold and the imprint material into contact with each other, wherein the control unit determines, based on information indicating a relationship between a relative tilt between the mold and the substrate, and a moment which fluctuates the relative tilt at a time of contact between the mold and the imprint material, a target relative tilt between the mold and the substrate such that a moment generated at the time of contact between the mold and the imprint material falls within an allowable range, and starts contact between the mold and the imprint material after setting the relative tilt between the mold and the substrate to the target relative tilt.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. In a description below, let a Z direction be a direction parallel to an optical axis of light to irradiate a substrate, and let an X direction and a Y direction be two directions perpendicular to the Z direction in a plane.

First Embodiment

An imprint apparatus 100 according to the first embodiment of the present invention will be described. The imprint apparatus is an apparatus that brings a mold and an imprint material supplied onto a substrate into contact with each other, and applies curing energy to the imprint material, thereby forming a pattern of a cured product to which the concave-convex pattern of the mold has been transferred. The imprint apparatus 100 is used to manufacture a semiconductor device or the like and performs an imprint process of forming a pattern of the imprint material on a shot region of a substrate 2 by using a mold 1 including a pattern region 1a where a pattern has been formed. For example, the imprint apparatus 100 cures the imprint material on the substrate in a state in which the mold 1, where the pattern has been formed, is in contact with the imprint material. Then, the imprint apparatus 100 can form the pattern of imprint material on the substrate by widening the spacing between the mold 1 and the substrate 2, and separating (releasing) the mold 1 from the cured imprint material.

A method of curing the imprint material includes a heat cycle method using heat and a photo-curing method using light. In this embodiment, an example in which the photo-curing method is adopted will be described. The photo-curing method is a method of curing the imprint material by supplying an uncured ultraviolet-curing resin as the imprint material onto the substrate, and irradiating the imprint material with light (ultraviolet light) in a state in which the mold 1 and the imprint material are in contact with each other.

A curable composition (may also be referred to as an uncured resin) which is cured by receiving curing energy is used for the imprint material. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave.

The curable composition is a composition that is cured by light irradiation or application of heat. Out of this, a photo-curable composition that is cured by light contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like.

The imprint material is applied on the substrate in a film-like shape by a spin coater or a slit coater. Alternatively, a liquid injection head may apply, on the substrate, the imprint material having a droplet-like shape, or an island-like shape or a film-like shape formed by a plurality of droplets connected to each other. The viscosity (viscosity at 25° C.) of the imprint material is set at, for example, 1 mPa·s (inclusive) to 100 mPa·s (inclusive).

[Apparatus Arrangement]

Figure 1:
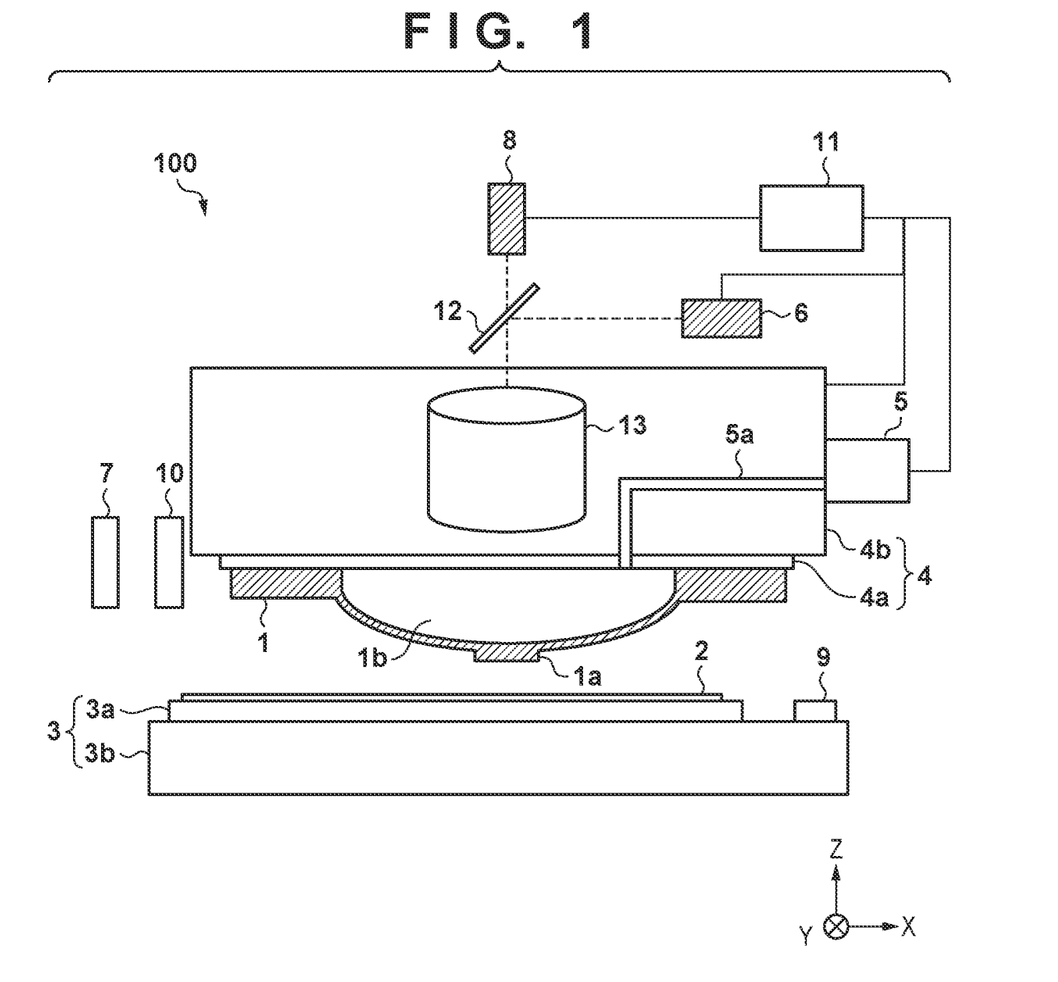
FIG. 1 is a schematic view showing an imprint apparatus according to the first embodiment.

The arrangement of the imprint apparatus 100 according to the first embodiment will now be described with reference to FIG. 1. FIG. 1 is a schematic view showing the imprint apparatus 100 according to the first embodiment. The imprint apparatus 100 can include a substrate stage 3, an imprint head 4, a deformation unit 5, an irradiation unit 6, a supply unit 7, an image capturing unit 8, a first measurement unit 9, a second measurement unit 10, and a control unit 11. The control unit 11 is constituted by a computer including, for example, a CPU and a memory, and controls the imprint process (controls the respective units of the imprint apparatus 100). The imprint process can include, for example, a process (contact process) of deforming the pattern region 1a of the mold 1 by the deformation unit 5, starting contact between the mold 1 and the imprint material on the substrate, and gradually widening the contact area between the mold 1 and the imprint material (substrate 2).

The substrate stage 3 includes, for example, a substrate holding unit 3a and a substrate driving unit 3b, and is configured to be movable while holding the substrate 2. The substrate holding unit 3a holds the substrate 2 by, for example, a vacuum suction force or an electrostatic force. The substrate driving unit 3b mechanically holds the substrate holding unit 3a, and drives the substrate holding unit 3a (substrate 2) in X and Y directions. The substrate driving unit 3b may also be configured to change the position of the substrate 2 in a Z direction, the tilt of the substrate 2 with respect to an X-Y plane, or the rotation of the substrate 2 on the X-Y plane. Note that glass, ceramics, a metal, a semiconductor, a resin, or the like is used for the substrate 2, and a member made of a material different from that of the substrate may be formed on the surface of the substrate as needed. More specifically, a silicon wafer, a compound semiconductor wafer, silica glass, or the like is used as the substrate. Before the imprint material is applied, an adhesion layer for improving the adhesion between the imprint material and the substrate may be provided, as needed.

The imprint head 4 can include a mold holding unit 4a which holds the mold 1 by, for example, the vacuum suction force or the electrostatic force, and a mold driving unit 4b configured to change the position and the tilt of the mold holding unit 4a (mold 1) in the Z direction. The mold driving unit 4b may also be configured to adjust the position of the mold 1 in the X and Y directions.

Figure 2:
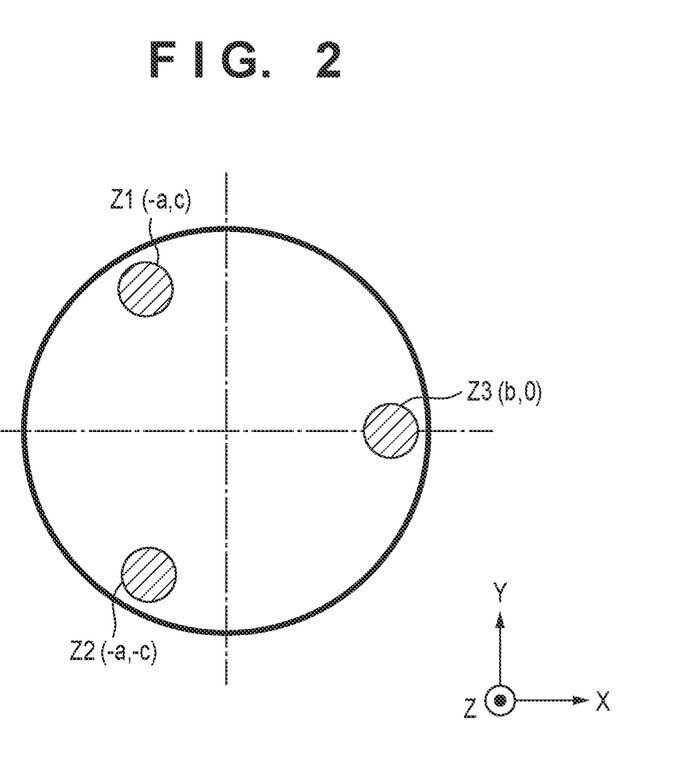
FIG. 2 is a view showing an imprint head when viewed from a Z direction.

The arrangement of the mold driving unit 4b will now be described with reference to FIG. 2. FIG. 2 is a view showing the imprint head 4 (mold driving unit 4b) when viewed from the Z direction. For example, the mold driving unit 4b includes a plurality of actuators Z1 to Z3 arranged as shown in FIG. 2, and can change the relative position (Z direction) and the relative tilt between the mold 1 and the substrate 2 by controlling each of the plurality of actuators Z1 to Z3. Each of the actuators Z1 to Z3 can include a displacement sensor $4b_1$ and a force sensor $4b_2$. The displacement sensor $4b_1$ detects a displacement amount between the both ends of each of the actuators Z1 to Z3 (an amount obtained by displacing the mold 1 by each of the actuators Z1 to Z3). The force sensor $4b_2$ detects a force generated in each of the actuators Z1 to Z3.

In this embodiment, the imprint head 4 functions as a driving unit which drives at least one of the mold 1 and the substrate so as to bring the mold 1 and the substrate 2 into contact with each other. However, the present invention is not limited to this. For example, the substrate stage 3 may function as the driving unit, or both the imprint head 4 and the substrate stage 3 may function as the driving units.

The mold 1 held by the imprint head 4 is normally made of a material such as quartz capable of transmitting ultraviolet light and includes the pattern region 1a where a concave-convex pattern that should be transferred onto the substrate 2 as a device pattern is formed on a surface (pattern surface) on a substrate side. The pattern region 1a has a mesa shape formed by, for example, a step of about several tens of μm. The size of the pattern region 1a is generally 33 mm×26 mm, though it changes depending on the device pattern that should be formed onto the substrate. In order to facilitate deformation in the pattern region, a cavity 1b (concave portion) is formed on a surface on a side opposite to the pattern surface in the mold 1 so as to make the thickness of the pattern region 1a and its periphery smaller. This cavity 1b becomes an almost airtightly sealed space by causing the imprint head 4 (mold holding unit 4a) to hold the mold 1. The cavity 1b is connected to the deformation unit 5 via a pipe 5a.

The deformation unit 5 deforms the pattern region 1a of the mold 1 into a convex shape protruding toward the substrate 2 by changing a pressure inside the cavity 1b of the mold 1 held by the imprint head 4. For example, when the mold 1 and the imprint material on the substrate are brought into contact with each other by bringing the mold 1 and the substrate 2 closer to each other, the deformation unit 5 makes the pressure inside the cavity 1b higher than its external pressure by, for example, supplying pressurized air to the inside of the cavity 1b via the pipe 5a. This allows the deformation unit 5 to deform the pattern region 1a of the mold 1 into the convex shape protruding toward the substrate 2, and to gradually widen the contact area between the mold 1 and the imprint material in the contact process. As a result, it is possible to reduce bubbles remaining in the concave-convex pattern (concave portion) of the mold 1 in contact with the imprint material and occurrence of a defect in the pattern formed in the imprint material by the imprint process.

The irradiation unit 6 irradiates the substrate 2 via the mold 1 with light (ultraviolet light) which cures the imprint material on the substrate in a process of curing the imprint material. In this embodiment, light emitted from the irradiation unit 6 is reflected by a beam splitter 12 (band filter), and irradiates the substrate 2 via a relay optical system 13 and the mold 1. The supply unit 7 supplies (dispenses) the imprint material onto the substrate. As described above, in the imprint apparatus 100 of this embodiment, the ultraviolet-curing resin having a property of curing by ultraviolet-light irradiation can be used as the imprint material.

The image capturing unit 8 captures an image of the pattern region 1a of the mold 1 via the beam splitter 12 and the relay optical system 13. For example, the image capturing unit 8 captures the image of the pattern region 1a of the mold 1 at each of a plurality of timings while the contact area between the pattern region 1a and the substrate 2 is widened in the contact process of bringing the mold 1 and the substrate 2 into contact with each other via the imprint material. In each image thus obtained by the image capturing unit 8, an interference fringe generated by contact between the mold 1 and the substrate 2 is formed. It is therefore possible to observe, based on each image, the way in which the contact area between the pattern region 1a and the imprint material is widened. An alignment scope (detection system) may be provided in order to detect alignment marks formed on the mold 1 and the substrate 2.

The first measurement unit 9 measures the heights of a plurality of points on the pattern region (on the mold). The first measurement unit 9 can include, for example, a laser interferometer which irradiates the mold 1 with light, and measures the height of an irradiation region on the mold irradiated with the light (distance between the first measurement unit 9 and the pattern region 1a) by reflected light from the irradiation region. The first measurement unit 9 is mounted on the substrate stage 3, and can measure the heights of the plurality of points on the pattern region by moving in the X and Y directions with the substrate stage 3 to scan the irradiation region on the mold. This makes it possible to obtain the shape and the tile of the pattern region 1a. Note that the first measurement unit 9 may be provided separately from the substrate stage 3.

The second measurement unit 10 measures the heights of a plurality of points on the substrate. The second measurement unit 10 can include, for example, a laser interferometer which irradiates the substrate 2 with light, and measures the height of an irradiation region on the substrate irradiated with the light (distance between the second measurement unit 10 and the substrate 2) by reflected light from the irradiation region. The second measurement unit 10 can measure the heights of the plurality of points on the substrate by causing the substrate stage 3 to move the substrate 2 in the X and Y directions to scan the irradiation region on the substrate. This makes it possible to obtain the shape and the tile of the substrate 2.

[Imprint Process]

Figure 3:
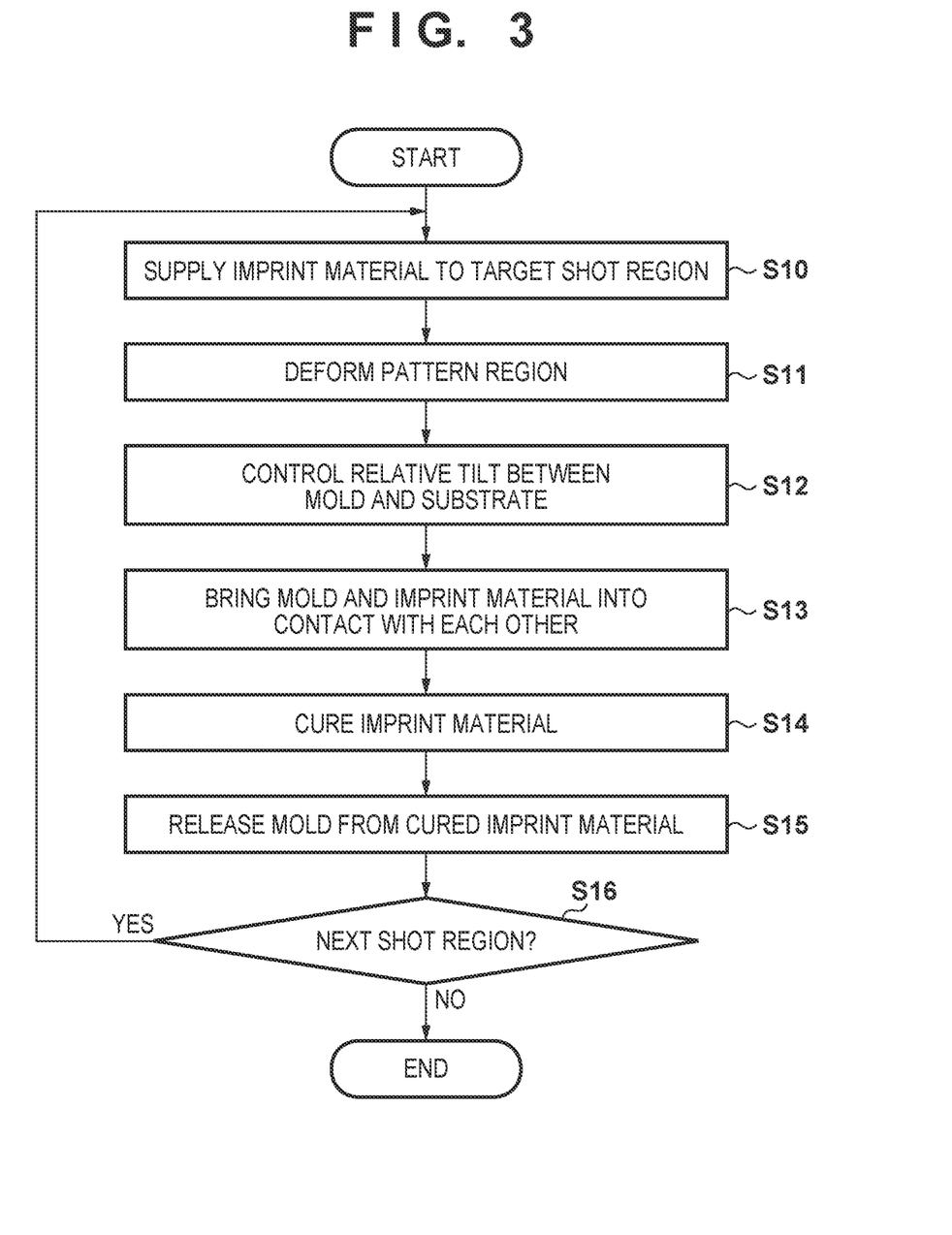
FIG. 3 is a flowchart showing a sequence of an imprint process.

The imprint process in the imprint apparatus 100 of the first embodiment will now be described with reference to FIG. 3. FIG. 3 is a flowchart showing the sequence of the imprint process. The control unit 11 can perform respective steps in the imprint process to be described below.

In step S10, the control unit 11 controls the substrate stage 3 so as to arrange the substrate 2 under the supply unit 7. Then, the control unit 11 controls the supply unit 7 so as to supply the imprint material to a shot region in which the imprint process is to be performed (target shot region) out of a plurality of shot regions formed on the substrate. After the imprint material is supplied to the target shot region, the control unit 11 controls the substrate stage 3 so as to arrange the target shot region under the mold 1 (pattern region 1a).

In step S11, the control unit 11 controls the deformation unit 5 so as to deform the pattern region 1a of the mold 1 into the convex shape protruding toward the substrate 2. In step S12, the control unit 11 controls the relative tilt between the mold 1 and the substrate 2 so as to obtain a target relative tilt between the mold 1 and the substrate 2 determined to be described later. Note that step S12 may be performed before step S11.

In step S13, the control unit 11 controls the imprint head 4 so as to bring the mold 1 and the substrate 2 closer to each other in a state in which the deformation unit 5 deforms the pattern region 1a of the mold 1, bringing the mold 1 and the imprint material on the substrate into contact with each other (contact process). For example, the control unit 11 starts contact between the mold 1 and the imprint material in the state in which the deformation unit 5 deforms the pattern region 1a of the mold 1, and gradually widens the contact area between the mold 1 and the imprint material. At this time, after starting contact between the mold 1 and the imprint material, the control unit 11 controls the deformation unit 5 so as to make the pressure inside the cavity 1b lower gradually as the contact area between the mold 1 and the imprint material is widened. This makes it possible to make the pattern region 1a when the entire pattern region 1a contacts the imprint material have a planar shape. The control unit 11 may also control the relative tilt between the mold 1 and the substrate 2 (that is, may control the imprint head 4) so as to make the pattern region 1a and the surface of the substrate 2 parallel to each other as the contact area between the mold 1 and the imprint material is widened.

In step S14, the control unit 11 controls, in the state in which the mold 1 and the imprint material are in contact with each other, the curing unit 6 so as to irradiate the imprint material with light, curing the imprint material. In step S15, the control unit 11 controls the imprint head 4 so as to separate the mold 1 and the substrate 2 from each other, separating (releasing) the mold 1 from the cured imprint material. This makes it possible to form a three-dimensional shape pattern conforming to the pattern of the mold 1 in the imprint material on the target shot region.

In step S16, the control unit 11 judges whether there is a shot region (next shot region) to which the pattern of imprint material is formed continuously on the substrate. If there is the next shot region, the process returns to step S10. If there is not the next shot region, the process ends.

[Method of Determining Target Relative Tilt Between Mold and Substrate]

In general, when the mold 1 and the imprint material on the substrate are brought into contact with each other, servo control of the relative tilt between the mold 1 and the substrate 2 can be performed in the imprint apparatus 100. However, if the mold 1 and the imprint material are brought into contact with each other in the state in which the pattern region 1a is deformed into the convex shape, a moment (also referred to as a fluctuation force) which fluctuates the relative tilt between the mold 1 and the substrate 2 may occur at the time of contact between the mold 1 and the imprint material. If such a moment occurs, the mold 1 and the substrate 2 may relatively swing while the contact area between the mold 1 and the imprint material is widened. As a result, a malfunction may be caused, such as insufficient filling of the concave portion of the concave-convex pattern of the mold 1 with the imprint material or the extension of a filling time with the imprint material. A malfunction may also be caused, such as unevenness which is developed in the thickness (a so-called Residual Layer Thickness (RLT)) between the substrate 2 and the concave portion of the pattern formed in the imprint material.

To cope with this, the control unit 11 of this embodiment generates information (to be referred to as "moment information with respect to relative tilt" hereinafter) indicating the relationship between the relative tilt between the mold 1 and the substrate 2, and the moment which fluctuates the relative tilt at the time of contact between the mold 1 and the imprint material. Then, based on the generated moment information with respect to relative tilt, the relative tilt between the mold 1 and the substrate 2 when the moment generated at the time of contact between the mold 1 and the imprint material falls within an allowable range is determined as a target relative tilt. The control unit 11 controls contact between the mold 1 and the imprint material on the substrate by using the target relative tilt thus determined. For example, the control unit 11 makes the relative tilt between the mold 1 and the substrate 2 be the target relative tilt in step S12 of FIG. 3, and then starts contact between the mold 1 and the imprint material in step S13 of FIG. 3. This makes it possible to reduce the moment generated at the time of contact between the mold 1 and the imprint material, and to reduce the above-described malfunctions.

Figure 4:
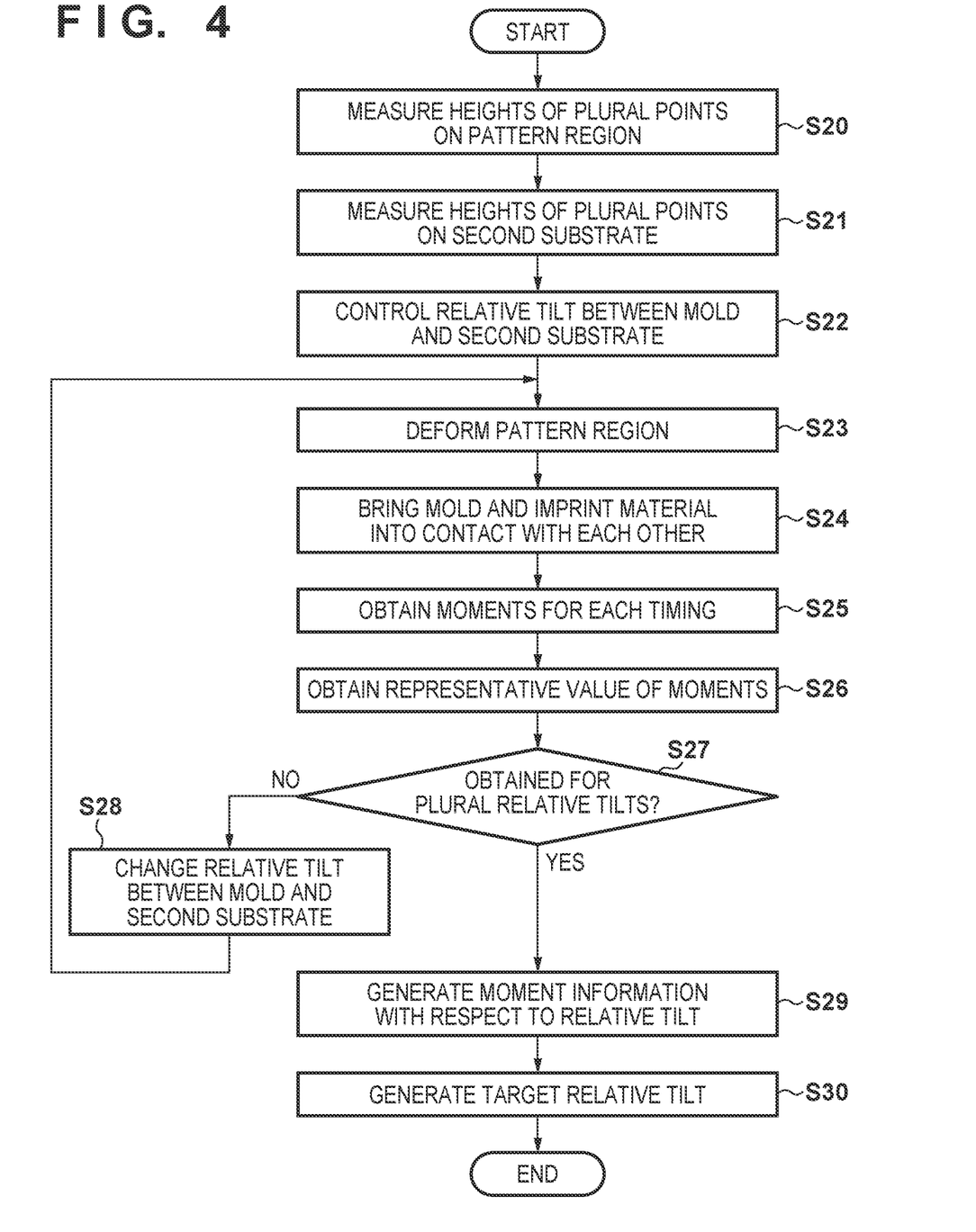
FIG. 4 is a flowchart showing a method of determining a target relative tilt between a mold and a substrate.

The method of determining the target relative tilt between the mold 1 and the substrate 2 will be described below. FIG. 4 is a flowchart showing the method of determining the target relative tilt between the mold 1 and a substrate 2. Respective steps to be described below can be performed by using, for example, the second substrate (dummy substrate) different from the substrate 2 instead of the substrate 2. In this embodiment, a description will be given assuming that the imprint material has already been supplied (dispensed) onto the second substrate. However, the present invention is not limited to this, and the imprint material may not be supplied onto the second substrate. In this case, in order to avoid damage to the mold 1 caused by contact to the second substrate, a buffer material such as an adhesion layer which adheres to the imprint material is preferably dispensed onto the second substrate. In this embodiment, the moment information with respect to relative tilt is generated by using the second substrate. However, the present invention is not limited to this. For example, the moment information with respect to relative tilt may be generated by using a predetermined shot region out of a plurality of shot regions on the substrate 2. Further, a tendency can be different for each mold, and it is thus preferable that the moment information with respect to relative tilt is generated for each mold.

In step S20, the control unit 11 causes the first measurement unit 9 to measure the heights of the plurality of points on the pattern region of the mold 1 while moving the substrate stage 3 in the X and Y directions. The deformation unit 5 does not deform the pattern region 1a here. In step S21, the control unit 11 causes the second measurement unit 10 to measure the heights of the plurality of points on the second substrate while moving the substrate stage 3 in the X and Y directions. Steps S20 and S21 may be performed simultaneously in one movement of the substrate stage 3.

In step S22, based on measurement results of the first measurement unit 9 and the second measurement unit 10, the control unit 11 controls the relative tilt between the mold 1 and the second substrate so as to make the second substrate and the mold 1 which is not deformed by the deformation unit 5 parallel to each other. Step S22 is performed by, for example, changing the tilt of the mold 1 by the imprint head 4. In this embodiment, the relative tilt between the mold 1 and the second substrate is controlled so as to make them parallel to each other in step S22. However, the present invention is not limited to this. For example, the control unit 11 may calculate the relative tilt between the mold 1 and the second substrate based on the measurement results of the first measurement unit 9 and the second measurement unit 10, and add, as an offset value, the calculated relative tilt to the target relative tilt between the mold 1 and the substrate 2 to be determined in the subsequent step.

Steps S23 to S28 are steps of obtaining moments which fluctuate the relative tilt between the mold 1 and the second substrate (substrate 2) at the time of contact between the mold 1 and the imprint material for each of a plurality of states different in relative tilt between the mold 1 and the second substrate. Note that it is preferable, in terms of a reproducibility, that the mold 1 and the imprint material are brought into contact with each other at the same position on the second substrate for the plurality of states of the relative tilt in step S24. It is therefore preferable that steps S23 to S28 are performed for each state of the relative tilt by using a plurality of second substrates onto each of which the imprint material has already been supplied.

In step S23, the control unit 11 controls the deformation unit 5 so as to deform the pattern region 1a of the mold 1 into the convex shape protruding toward the second substrate. In step S24, the control unit 11 controls the imprint head 4 so as to bring the mold 1 and the second substrate closer to each other in the state in which the deformation unit 5 deforms the pattern region 1a of the mold 1, performing the contact process of bringing the mold 1 and the imprint material on the second substrate into contact with each other. At this time, the control unit 11 brings the mold 1 and the imprint material into contact with each other while performing servo control of the orientation of the mold 1 based on a detection result in the displacement sensor $4b_1$ provided in each of the actuators Z1 to Z3 so as to maintain the relative tilt between the mold 1 and the second substrate. Further, the control unit 11 obtains a detection result in the force sensor $4b_2$ provided in each of the actuators Z1 to Z3 at each of the plurality of timings in the contact process.

In step S25, based on the detection result in the force sensor $4b_2$, the control unit 11 obtains the moments which fluctuate the relative tilt between the mold 1 and the second substrate at each of the plurality of timings. For example, by using the coordinates (the positions in the X and Y directions) of each of the actuators Z1 to Z3, a moment $\Delta Mx$ which fluctuates the relative tilt between the mold 1 and the second substrate around an X-axis and a moment $\Delta My$ which fluctuates the relative tilt between the mold 1 and the second substrate around a Y-axis can be obtained by:

$$\Delta Mx(t)=-aF1(t)-aF2(t)+bF3(t) \quad (1)$$

$$\Delta My(t)=cF1(t)-cF2(t) \quad (2)$$

where a, b, and c represent the coordinates (see FIG. 2) of the respective actuators Z1 to Z3, F1, F2, and F3 represent detection results in the force sensors $4b_2$ provided in the respective actuators Z1 to Z3, and t represents a time.

Figure 5:
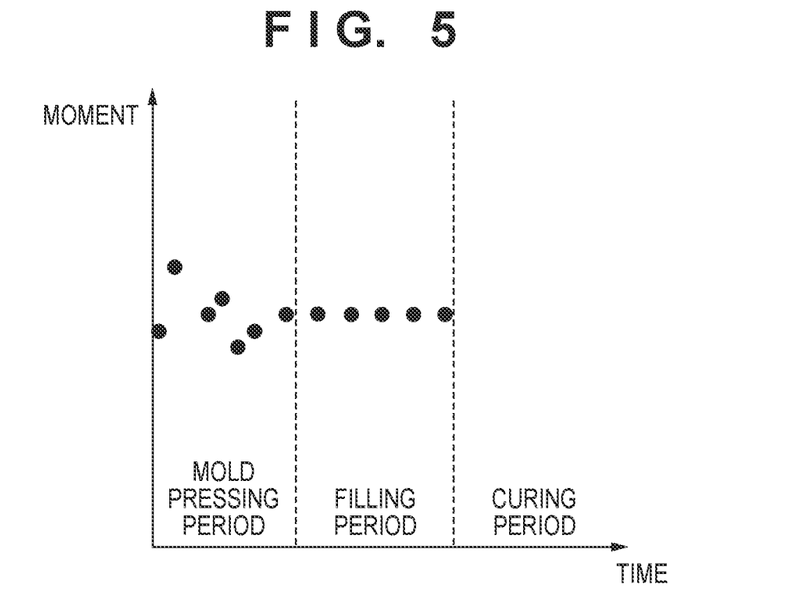
FIG. 5 is a graph showing moment information with respect to time.

It is possible, by thus obtaining the moments at each timing (each time), to obtain information (to be referred to as "moment information with respect to time" hereinafter) indicating the relationship between the time and the moments as shown in FIG. 5. As shown in FIG. 5, the moments tend to converge as the contact area between the mold 1 and the imprint material on the second substrate is widened in a period (mold pressing period) during which the contact area between the mold 1 and the imprint material is widened. Further, the moments become almost constant in a period (filling period) during which the concave portion of the concave-convex pattern of the mold 1 is filled with the imprint material without changing the contact area between the mold 1 and the imprint material.

In step S26, the control unit 11 obtains a representative value of the moments based on the moment information with respect to time. For example, an average value of moments at predetermined times in the periods (the mold pressing period and the filling period) of the contact process or the moments in the periods in the contact process can be used as the representative value of the moments. Note that as shown in FIG. 5, the moments are more stable in the filling period than in the mold pressing period. It is therefore preferable that, for example, the average value of the moments at the predetermined times in the filling period or the moments in the filling period is used as the representative value of the moments.

In step S27, the control unit 11 judges whether the representative value of the moments is obtained for each of the plurality of states different in relative tilt between the mold 1 and the second substrate. If the representative value of the moments is not obtained for each of the plurality of states of the relative tilt, the control unit 11 changes the relative tilt between the mold 1 and the second substrate in step S28, and then the process returns to step S23. On the other hand, if the representative value of the moments is obtained for each of the plurality of states of the relative tilt, the process advances to step S29. Note that the number of plurality of states of the relative tilt (that is, the number of repetitions of steps S23 to S26) can be set arbitrarily.

Figure 6:
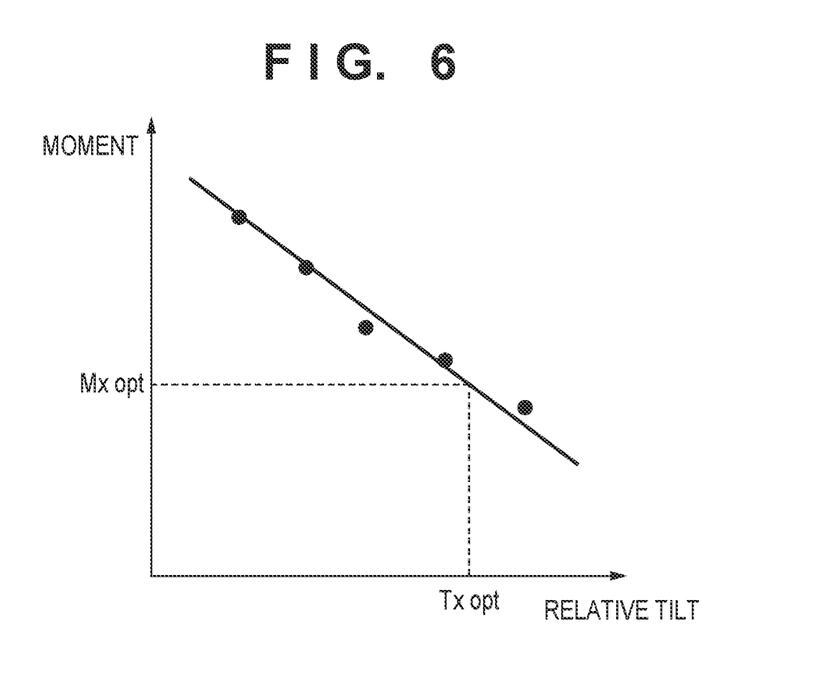
FIG. 6 is a graph showing the moment information with respect to relative tilt.

In step S29, the control unit 11 generates the moment information with respect to relative tilt based on the representative value of the moments obtained for each of the plurality of states of the relative tilt. FIG. 6 is a graph showing the moment information relative to relative tilt. The moment information with respect to relative tilt can be generated for each of the moment which fluctuates the relative tilt between the mold 1 and the second substrate around the X-axis, and the moment which fluctuates the relative tilt between the mold 1 and the second substrate around the Y-axis. The moment information with respect to relative tilt thus generated can be stored in a memory. The moment information with respect to relative tilt may be stored in the memory by, for example, a mathematical expression such as a first-degree approximate expression by a least square method.

In step S30, the control unit 11 obtains, based on the moment information with respect to relative tilt generated in step S28, relative tilt when each moment falls within the allowable range. For example, based on the moment information with respect to relative tilt, the control unit 11 obtains relative tilt (Tx_opt) when each moment becomes an allowable value (Mx_opt). Then, the obtained relative tilt is determined as the target relative tilt between the mold 1 and the substrate 2 when the mold 1 and the imprint material are brought into contact with each other. The allowable range of each moment can be set to, for example, a range of the moment when a difference among forces generated in the plurality of actuators Z1 to Z3 falls within a target range. The allowable range of each moment can preferably be set to a range having the value of the moment when the difference among the forces generated in the plurality of actuators Z1 to Z3 becomes zero. Alternatively, the allowable range of each moment can be set to a range having the value of the moment when the difference between the maximum value and the minimum value of the moment (a variation in the moment) becomes the smallest. Furthermore, the allowable range of each moment may be set to a range of the moment when a distortion of the pattern transferred onto the substrate 2 falls within a target range. The moment when the distortion falls within the target range can be obtained by, for example, an experiment, a simulation, or the like.

In this embodiment, an example has been described in which the target relative tilt is determined from the allowable range of each moment based on the moment information with respect to relative tilt. However, there may be a case in which, for example, the relative tilt between the mold 1 and the substrate 2 when the distortion of the pattern transferred onto the substrate 2 falls within the target range is obtained by an experiment or the like for a predetermined shot region on the substrate when the allowable range of each moment is obtained. In this case, the relative tilt can be set to the target relative tilt for the predetermined shot region and based on the moment information with respect to relative tilt generated as described above, the allowable value (allowable range) of each moment can be determined from the set target relative tilt. Then, the allowable value of the moment thus determined can be used when target relative tilt for a shot region different from the predetermined shot region out of each of the plurality of shot regions is determined, as will be described in the second embodiment.

As described above, the imprint apparatus 100 of this embodiment generates the moment information with respect to relative tilt and based on the information, determines the relative tilt between the mold 1 and the substrate 2 when each moment falls within the allowable range as the target relative tilt. Then, the imprint apparatus 100 starts contact between the mold 1 and the imprint material by setting the relative tilt between the mold 1 and the substrate 2 as the target relative tilt. This makes it possible to reduce, in the contact process, the malfunction such as insufficient filling of the concave portion of the concave-convex pattern of the mold 1 with the imprint material or the extension of the filling time with the imprint material.

Second Embodiment

In an imprint apparatus 100, in a plurality of shot regions on a substrate, moments generated at the time of contact between a mold 1 and an imprint material can be different depending on places of the shot regions. In particular, the moments can be different largely between a shot region (a so-called full shot region) to which an entire pattern region 1a of the mold 1 is transferred and a shot region (a so-called partial shot region) to which only a part of the pattern region 1a of the mold is transferred. It is therefore preferable that target relative tilt between the mold 1 and a substrate 2 is determined for each of the plurality of shot regions. It is cumbersome, however, to generate moment information with respect to relative tilt for each of the plurality of shot regions. Therefore, in the second embodiment, a method of obtaining, based on moment information with respect to relative tilt generated for one shot region out of the plurality of shot regions, target relative tilt in the other shot regions will be described.

In a description below, in the first shot region out of the plurality of shot regions, the moment information with respect to relative tilt has already been generated by performing respective steps of the flowchart shown in FIG. 4 described above. Therefore, a method of determining, based on the moment information with respect to relative tilt generated for the first shot region, target relative tilt for the second shot region different from the first shot region out of the plurality of shot regions will be described.

Figure 7:
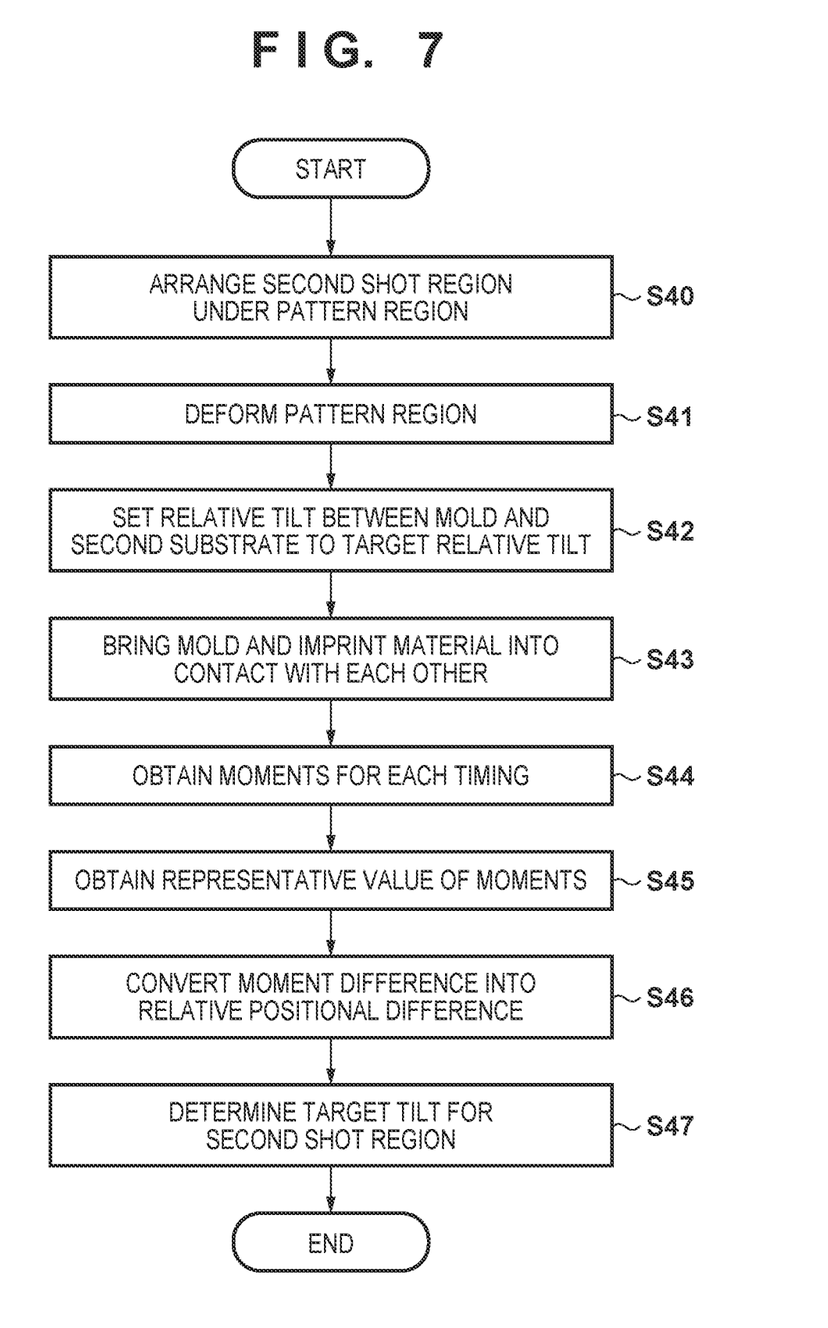
FIG. 7 is a flowchart showing a method of determining a target relative tilt for the second shot region.

FIG. 7 is a flowchart showing the method of determining the target relative tilt for the second shot region based on the moment information with respect to relative tilt for the first shot region. Respective steps to be described below can be performed by using, for example, the second substrate (dummy substrate) different from the substrate 2 instead of the substrate 2. Note that the plurality of shot regions are formed in the same layout between the substrate 2 and the second substrate. That is, positions on the substrate in the first shot region and the second shot region are, respectively, identical between the substrate 2 and the second substrate.

In step S40, a control unit 11 controls a substrate stage 3 to arrange the second shot region on the second substrate under the pattern region 1a of the mold 1. In step S41, the control unit 11 controls a deformation unit 5 so as to deform the pattern region 1a of the mold 1 into a convex shape protruding toward the second substrate. In step S42, the control unit 11 controls an imprint head 4 such that the relative tilt between the mold 1 and the second substrate becomes a target relative tilt (Tx_opt) determined for the first shot region.

In step S43, the control unit 11 controls the imprint head 4 so as to bring the mold 1 and the second substrate (second shot region) closer to each other, and performs a contact process of bringing the mold 1 and an imprint material on the second shot region into contact with each other. At this time, the control unit 11 brings the mold 1 and the imprint material into contact with each other while performing servo control of the orientation of the mold 1 based on a detection result in a displacement sensor $4b_1$ provided in each of actuators Z1 to Z3 so as to maintain the relative tilt between the mold 1 and the second substrate. Further, the control unit 11 obtains a detection result in a force sensor $4b_2$ provided in each of the actuators Z1 to Z3 at each of a plurality of timings in the contact process.

In step S44, based on the detection result in the force sensor $4b_2$, the control unit 11 obtains, by using equations (1) and (2) described above, a moment which fluctuates the relative tilt between the mold 1 and the second substrate at each of the plurality of timings. This makes it possible to obtain moment information with respect to time for the second shot region. In step S45, the control unit 11 obtains a representative value of the moments based on the moment information with respect to time. The representative value of the moments is preferably obtained under the same condition as a condition when a representative value of the moments for the first shot region is obtained. The obtained representative value of the moments is set as a moment $M_2$ for the second shot region.

Figure 8:
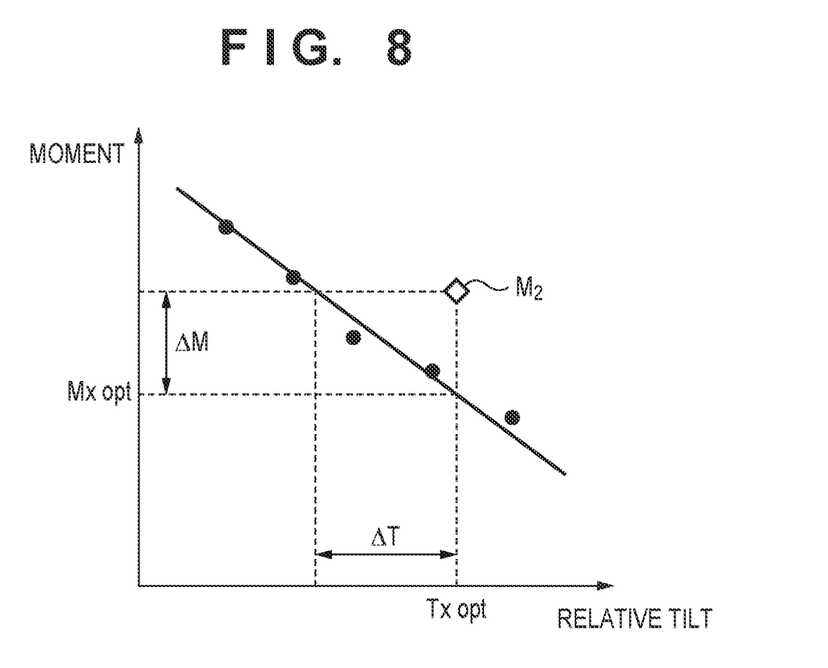
FIG. 8 is a graph for explaining the method of determining the target relative tilt for the second shot region.

In step S46, based on the moment information with respect to relative position generated for the first shot region, the control unit 11 converts a moment difference (ΔM) between the first shot region and the second shot region into a relative positional difference (ΔT). For example, a moment corresponding to the target relative tilt (Tx_opt) is a target value (Mx_opt) in the first shot region, and thus the control unit 11 obtains the difference (ΔM) between the moment $M_2$ and the target value (Mx_opt) for the second shot region as shown in FIG. 8. Then, the control unit 11 converts the difference (ΔM) into the relative positional difference (ΔT) based on the moment information with respect to relative position, as shown in FIG. 8. In step S47, the control unit 11 determines the target relative tilt for the second shot region by correcting the target relative tilt (Tx_opt) determined for the first shot region with the relative positional difference (ΔT) obtained in step S46.

Figure 9:
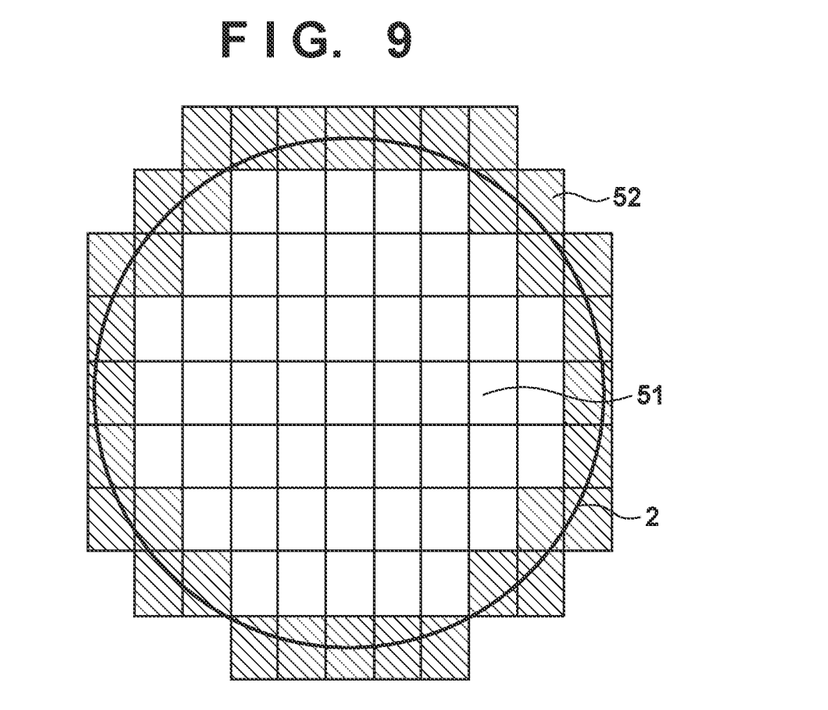
FIG. 9 is a view showing the layout of a plurality of shot regions.

As shown in FIG. 9, the step of determining the target relative tilt in accordance with the flowchart of FIG. 7 can be performed for all the shot regions including a full shot region 51 and a partial shot region 52. The target relative tilt can be determined for each of relative tilt around an X-axis and relative tilt around a Y-axis. This makes it possible to determine the target relative tilt for each of the plurality of shot regions formed on the substrate 2. Note that the target relative tilt may be determined for each of a mold pressing period and a filling period.

<Embodiment of Method of Manufacturing Article>

A method of manufacturing an article according to an embodiment of the present invention is suitable for manufacturing an article, for example, a microdevice such as a semiconductor device or an element having a microstructure. A pattern of a cured product molded using an imprint apparatus is used permanently for at least some of various articles or used temporarily when the various articles are manufactured.

The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold. The pattern of the cured product is used without any change as a constituent member of at least some of the above-described articles or used temporarily as a resist mask. The resist mask is removed after etching, ion implantation, or the like is performed in a processing step of a substrate.

The method of manufacturing the article according to this embodiment includes a step of forming a pattern in a resin dispensed onto the substrate (step of performing an imprint process on the substrate) using the above-described imprint apparatus, and a step of processing the substrate on which the pattern has been formed in the preceding step. This manufacturing method further includes other well-known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-087383 filed on Apr. 25, 2016, which is hereby incorporated by reference herein in its entirety.

What is claimed is:

1. An imprint apparatus which forms a pattern of an imprint material on a substrate by using a mold, the apparatus comprising:
    a deformation unit configured to deform the mold into a convex shape protruding toward the substrate; and
    a driving unit including a plurality of actuators, and configured to relatively drive the mold and the substrate by the plurality of actuators so as to bring the mold and the imprint material on the substrate into contact with each other;
    a control unit configured to control a process of bringing the mold and the imprint material into contact with each other by the driving unit, while controlling deformation of the mold by the deformation unit,
    wherein the control unit
        obtains moment information indicating a relationship between an initial relative tilt between the mold and the substrate before starting contact between the mold and the imprint material on the substrate, and a value of a moment to be generated between the mold and the substrate by starting contact between the mold and the imprint material with the initial relative tilt,
        determines, based on the obtained moment information, a target relative tilt between the mold and the substrate such that a value of the moment falls within a predetermined range, and
        starts contact between the mold and the imprint material after setting the relative tilt between the mold and the substrate to the target relative tilt, and
    wherein the moment information is created based on respective states of the plurality of actuators when starting contact between the mold and the imprint material with the initial relative tilt.

2. The apparatus according to claim 1, wherein the substrate includes a plurality of shot regions, and
    the control unit determines, based on the moment information, the target relative tilt between the mold and the substrate for each shot region.

3. The apparatus according to claim 2, wherein the plurality of shot regions include a first shot region and a second shot region, and
    the control unit converts, based on the moment information, a moment difference between the first shot region and the second shot region into a relative tilt difference, and determines a target relative tilt for the second shot region by correcting a target relative tilt determined for the first shot region with the relative tilt difference.

4. The apparatus according to claim 1, wherein the moment information is created by obtaining a value of the moment for each of a plurality of initial relative tilts which are different from each other.

5. The apparatus according to claim 1, further comprising a sensor configured to detect forces generated in the plurality of actuators,
    wherein the control unit creates the moment information by obtaining a value of the moment based on results of causing the sensor to detect forces respectively generated in the plurality of actuators when starting contact between the mold and the imprint material with the initial relative tilt.

6. The apparatus according to claim 5, wherein the predetermined range is a range of the moment when a difference among the forces respectively generated in the plurality of actuators falls within a target range.

7. The apparatus according to claim 1, wherein the moment information is created for each mold.

8. The apparatus according to claim 1, wherein the predetermined range is a range of the moment when a distortion of a pattern of the imprint material formed on the substrate falls within a target range.

9. The apparatus according to claim 1, wherein the control unit controls contact between the mold and the imprint material so as to maintain the target relative tilt between the mold and the substrate.

10. A method of manufacturing an article, the method comprising:
    forming a pattern on a substrate using an imprint apparatus;
    processing the substrate, on which the pattern has been formed, to manufacture the article,
    wherein the imprint apparatus which forms the pattern of the imprint material on the substrate by using a mold, and includes:
    a deformation unit configured to deform the mold into a convex shape protruding toward the substrate; and
    a driving unit including a plurality of actuators, and configured to relatively drive the mold and the substrate by the plurality of actuators so as to bring the mold and the imprint material on the substrate into contact with each other;
    a control unit configured to control a process of bringing the mold and the imprint material into contact with each other by the driving unit, while controlling deformation of the mold by the deformation unit,
    wherein the control unit
        obtains moment information indicating a relationship between an initial relative tilt between the mold and the substrate before starting contact between the mold and the imprint material on the substrate, and a value of a moment to be generated between the mold and the substrate by starting contact between the mold and the imprint material with the initial relative tilt,
        determines, based on the obtained moment information, a target relative tilt between the mold and the substrate such that a value of the moment falls within a predetermined range, and starts contact between the mold and the imprint material after setting the relative tilt between the mold and the substrate to the target relative tilt, and wherein the moment information is created based on respective states of the plurality of actuators when starting contact between the mold and the imprint material with the initial relative tilt.

11. An imprint method of forming a pattern of an imprint material on a substrate by using a mold, the method comprising:

obtaining moment information indicating a relationship between an initial relative tilt between the mold and the substrate before starting contact between the mold and the imprint material on the substrate, and a value of a moment to be generated between the mold and the substrate by starting contact between the mold and the imprint material with the initial relative tilt, determining, based on the obtained moment information, a target relative tilt between the mold and the substrate such that a value of the moment falls within a predetermined range;

deforming the mold into a convex shape protruding toward the substrate, and starting contact between the mold and the imprint material after setting the relative tilt between the mold and the substrate to the determined target relative tilt, wherein the moment information is created based on respective states of a plurality of actuators when starting contact between the mold and the imprint material with the initial relative tilt, the plurality of actuators constituting a driving unit of relatively driving the mold and the substrate so as to bring the mold and the imprint material on the substrate into contact with each other.

12. The apparatus according to claim 1, further comprising a memory configured to store the information, wherein the control unit stores the moment information created in advance in the memory, and determines the target relative tilt based on the moment information obtained from the memory.

13. The apparatus according to claim 1, wherein the predetermined range includes a value of the moment when a difference among forces respectively generated in the plurality of actuators is zero.

14. The apparatus according to claim 1, wherein the moment information is created by obtaining the value of the moment based on results of detecting forces respectively generated in the plurality of actuators when starting contact between the mold and the imprint material with the initial relative tilt.

15. The apparatus according to claim 1, wherein the mold includes a pattern region to be contacted to the imprint material on the substrate, the pattern region having a pattern to be transferred to the imprint material, and the control unit controls, after starting contact between the mold and the imprint material on the substrate with the target relative tilt, a relative tilt between the mold and substrate so as to make the pattern region and the substrate parallel to each other as a contact area between the pattern region and the imprint material increases.

* * * * *